United States Patent [19]

von der Ropp

[11] 4,419,332

[45] Dec. 6, 1983

[54] EPITAXIAL REACTOR

[75] Inventor: Hubert von der Ropp, Nordheim, Fed. Rep. of Germany

[73] Assignee: Licentia Patent-Verwaltungs-G.m.b.H., Frankfurt am Main, Fed. Rep. of Germany

[21] Appl. No.: 200,548

[22] Filed: Oct. 21, 1980

[30] Foreign Application Priority Data

Oct. 29, 1979 [DE] Fed. Rep. of Germany ....... 2943634

[51] Int. Cl.³ ............................................. C30B 25/10
[52] U.S. Cl. .................................. 422/245; 156/613; 118/725
[58] Field of Search ................ 422/245, 247; 148/175; 118/719, 720, 724, 725, 728; 423/349; 427/86, 95; 156/610, 613, 614

[56] References Cited

U.S. PATENT DOCUMENTS

| | | | |
|---|---|---|---|
| 3,098,763 | 7/1963 | Deal et al. | 118/725 |
| 3,220,380 | 11/1965 | Schaarschmidt | 118/725 |
| 3,391,270 | 7/1968 | Harris et al. | 118/725 |
| 3,603,284 | 9/1971 | Garnache | 118/725 |
| 3,659,552 | 5/1972 | Briody | 118/725 |
| 3,704,987 | 12/1972 | Arndt et al. | 118/725 |
| 3,862,397 | 1/1975 | Anderson et al. | 156/610 |
| 3,885,061 | 5/1975 | Corboy et al. | 156/613 |
| 3,915,119 | 10/1975 | Roy et al. | 118/725 |
| 4,099,041 | 7/1978 | Berkman et al. | 118/728 |

FOREIGN PATENT DOCUMENTS

| | | |
|---|---|---|
| 2234119 | 2/1973 | Fed. Rep. of Germany . |
| 71753 | 3/1970 | German Democratic Rep. . |
| 1382353 | 1/1975 | United Kingdom . |

OTHER PUBLICATIONS

Bratter et al., IBM Technical Bulletin, vol. 16, No. 1, Jun. 1973, p. 4.

*Primary Examiner*—Hiram H. Bernstein
*Attorney, Agent, or Firm*—Spencer & Kaye

[57] ABSTRACT

An epitaxial reactor comprises an enclosed evacuable container, a heating tube in the container in the wall of which there is a heat source and a temperature control system which is sealed at one end, a feed line for reaction gas, which line passes along the heating tube so as to provide an outlet for reaction gas adjacent the seal, and means for accommodating the elements to be treated on the inside of the heating tube.

10 Claims, 1 Drawing Figure

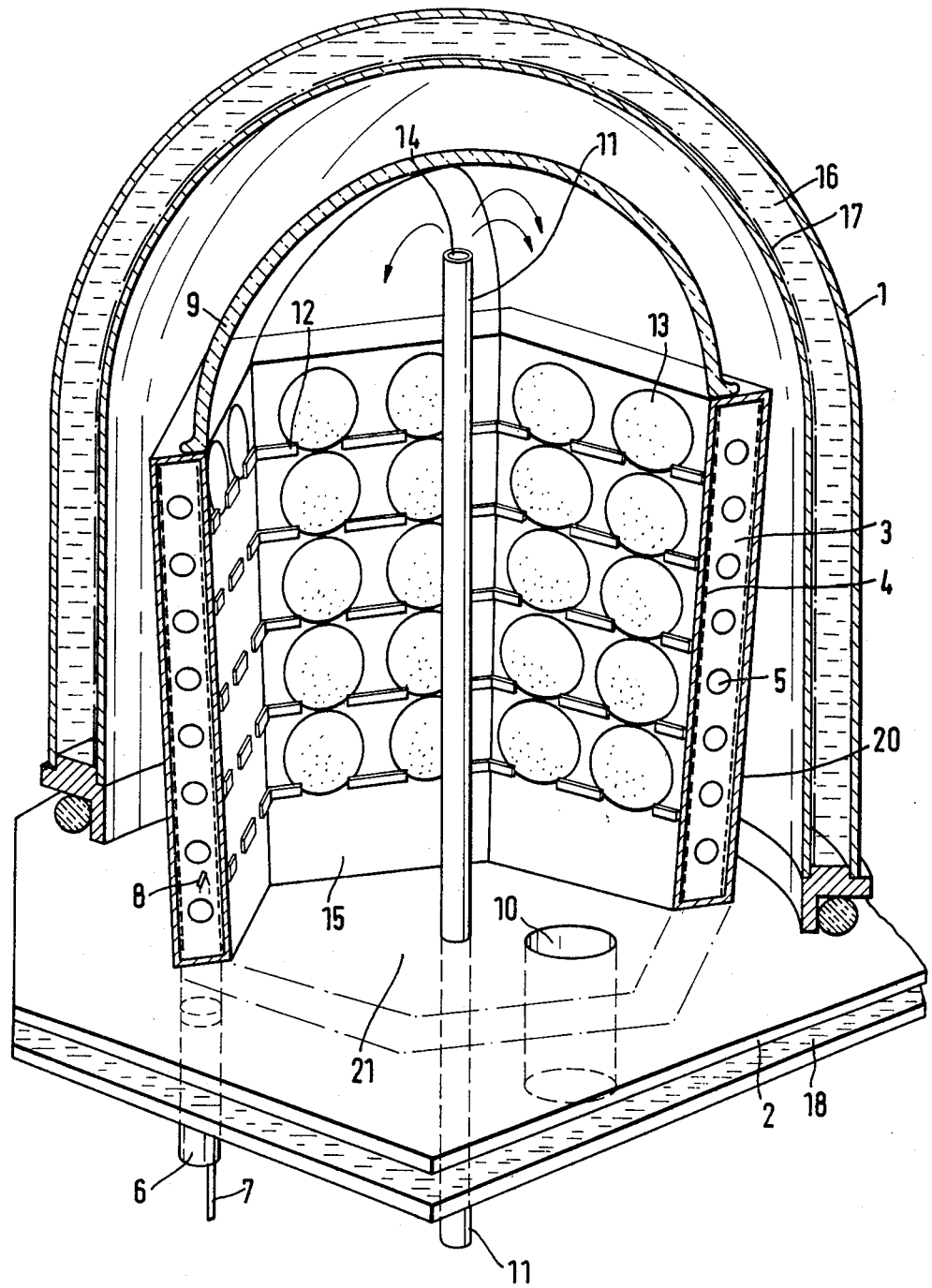

EPITAXIAL REACTOR

BACKGROUND OF THE INVENTION

The invention relates to an epitaxial reactor having an enclosed and evacuable container. Known reactors comprise an evacuable container which is surrounded, for example, by a heating device comprising lights or lamps. By way of example, a cylindrical susceptor or receptacle is arranged in the container and accommodates the elements to be coated, these elements being housed in pockets on the outer walls of the susceptor or receptacle. Once the desired pressure and temperature ratios have been set in the reactor, the reaction gas is allowed to flow in and flows through in the reaction chamber between the susceptor and the inner walls of the container while depositing the desired layers on the substrate elements.

In these known reactors the wall of the container must be as cold as possible in order not to reduce their permeability to heat radiation and in order to prevent reaction products from being precipitated on the inner walls of the container. This type of coating of the inner wall of the reactor container leads to interactions which have a negative effect on the thickness of the layers and the homogeneity of the layers which are to be deposited.

These known reactors have a series of disadvantages caused by the apparatus. For this reason, the lack of uniformity of the temperature within the gas flow is very large and can be up to 500° C./cm. The requirements made of the lamp or light type heating are great and a high power consumption is necessary in order to bring the substrate elements on the susceptor to the required reaction temperature. In turn this means high cost air and water cooling.

SUMMARY OF THE INVENTION

It is an object of the invention to provide an epitaxial reactor which makes it possible to manufacture epitaxial layers of high crystal perfection while having the precondition of a high degree of uniformity of temperature in the flow of reaction gas. Furthermore, the reactor system should be capable of being operated at a relatively low cost in terms of energy.

According to the invention there is provided an epitaxial reactor comprising an enclosed evacuable container, a heating tube in said container, a heat source and a temperature control system in a wall of said heating tube, a seal at one end of said heating tube, a feed line for reaction gas and passing along said heating tube to define an outlet opening for reaction gas adjacent said seal and means on the inside of said heating tube for accommodating elements to be coated.

Further according to the invention there is provided an epitaxial reactor comprising an enclosed and evacuable container, a heating tube containing a heat source and a temperature control system in a wall thereof arranged in said container and provided at one end with a seal; a transport line for the reaction gas passing through the heat tube, the inside of the heat tube is provided for the purpose of accommodating the elements which are to be coated, and which line has an outlet opening for the reaction gas near the seal.

BRIEF DESCRIPTION OF THE DRAWINGS

The invention will now be described in greater detail, by way of example, with reference to the drawing, the single FIGURE of which shows one embodiment of the invention in a perspective and sectional view.

DESCRIPTION OF THE PREFERRED EMBODIMENT

The invention proposes to provide an epitaxial reactor in which a heated tube is arranged in the container, the heated tube containing the heat source and a temperature control system in its walls and being provided at one end with a seal. A flow line is provided for the reaction gas which passes through the heated tube, the inside of which is provided with means for accommodating the elements to be coated. This transport line contains an outlet opening for the reaction gas close to the seal.

By a heated tube is meant a system operating according to the so-called "heat pipe" principle. Such a heated tube (heat pipe) comprises two concentrically arranged tubes or pipes which are inserted one into the other, the double walls forming a sealed off chamber. The surface of this chamber in the wall is coated with wire meshing and a small quantity of sodium or some other substance fills the cavity. This substance is received or absorbed through the capillary structure of the wire meshing so that the inner surface of the wall space is coated with a film. During heating, the sodium used by way of example, vaporizes and the same vapour pressure exists everywhere. As a result, the whole of the surface rinsed in sodium vapour comes into equilibrium at the same temperature i.e., the saturation temperature corresponding to the vapour pressure. If the temperature falls below this equilibrium value at one point, then sodium vapour condenses there and the condensation heat released increases the temperature at this point until on equilibrium temperature is re-established. An extremely high constancy in temperature having an automatic control machanism may be achieved because of this measure in the operating chamber surrounded by the heated tube (heat pipe).

The so-called "heat pipe" principle is utilized in the epitaxial reactor in accordance with the invention, the reaction gas flowing through the inner chamber surrounded by the heat pipe and in which the substrate elements are also housed. This measure makes it possible to maintain a very high homogeneity of temperature in the gas flow, this uniformity being less than 10° C./cm. The outer wall of the reactor is no longer of importance to the epitaxial process since the heat source is accommodated in the walls of the heat pipe. When using a heat pipe, the heating may be very easily controlled by measuring the vapour pressure, for example, and using it to control the heat output of the heating system housed in the heat pipe. The epitaxial reactor in accordance with the invention does not contain any moving parts and therefore can be sealed off easily. Since the heat source may be housed in the susceptor itself, which is formed by the heat pipe, the energy consumption is considerably smaller than in conventional reactor systems. When using the new epitaxial reactor, very good epitaxial layers may be produced on semiconductor elements, it being possible to achieve fluctuations in layer thickness of less than 2% of the desired value. The deviations in conductivity of the deposited layers are also less than 2%.

Since the resistance heating may be housed in the walls of the heat pipes in the epitaxial reactor, the outer container wall of the reactor is no longer of any importance to the passage of heat of the heating device. The outer wall of the container remains relatively cool and may be air- and water-cooled at low cost.

The heat pipe is covered by a layer on the surface provided for accommodating the elements to be coated, this layer being capable of resistance to the reaction gases used. This is the case for example with a silicon carbide layer. The heat pipe preferably has a polygonal cross-section in order to have favourable coating conditions for the elements to be coated. The cross-section of the heat pipe tapers in the direction of the movement of the reaction gas. Upwardly inclined support surfaces are formed for the reaction elements so that they may be mounted easily and subjected optimally to the reaction gas. The cross-section of the heat pipe may be hexagonal or octagonal for example. The upper seal of the heat pipe comprises, for example a detachable quartz dome. The epitaxial reactor is preferably used to deposit semiconducting epitaxial layers on semiconductor substrate elements which comprise for example, a monocrystalline silicon.

Referring now to the drawing one embodiment of epitaxial reactor, according to the invention is shown in section and perspective view. It comprises a double-walled outer container 1 which, together with the baseplate 2, encloses the inner chamber of the reactor. The baseplate is also preferably double-walled. The cavities 16 and 18 of the double-walled container and the baseplate are preferably connected to a water cooling system. The baseplate has three openings in all, the first opening 10 being connected to a pump for the purpose of evacuating the reaction vessel and pumping away the reaction gas. The second opening is taken up by the transport tube 11 for the reaction gas while the wall interior of the heat pipe is connected to the third opening 6. The connections for the system of heating, measurement and control pass through this opening 6.

The heat pipe 20 is located inside the container 1. In the embodiment shown this double-walled metal tube with an inner chamber in its walls which is sealed off is hexagonal in cross-section and tapers downwardly. Inside the walls, a heating coil 5 and wire meshing 4 are located, the latter accommodating sodium or some other suitable substance with the aid of its capillary action. The heat pipe is provided at the top with a dome or globe-like closure element or seal 9 which comprises quartz glass, for example, and prevents the reaction gas from passing out into the reactor chamber outside the heat pipe.

Furthermore, a sensor 8 for measuring the vapour pressure, for example the sodium vapour pressure, is located in the walls of the heat pipe, the said vapour pressure corresponding to a respective reaction temperature. The sensor 8 is connected to a measurement and control system which lies outside the reactor via a measurement line 7.

The transport pipe or conduit or a tube for the reaction gas is passed through the inner chamber 21 encircled by the heat pipe. This tube has an outlet opening 14 for the reaction gas directly in the vicinity of the dome like seal 9, so that the reaction gas has to flow downwards through the reaction chamber 21 encircled by the heat pipe.

The reaction gas is heated as it rises in the transport tube 11 and passes out of the opening 14 at the desired reaction temperature. The inner walls of the susceptor or which latter comprises for example the double-walled and hexagonal metal tube, is covered on the upper surface facing the reaction chamber 21 by a layer 15 comprising silicon carbide. This receiving surface for the elements 13 which are to be coated may have pockets into which semiconductor discs or chips 13 comprising monocrystalline silicon for example, are placed. Depressions may be provided in the susceptor receptacle for this purpose. The pockets may also comprise frame-like members made of quartz glass or supporting bars 12. Since an extreme constancy of temperature prevails in the reaction chamber 21 because of the use of the "heat pipe" system extremely homogeneous layers having a high crystal perfection may be produced with the aid of the epitaxial reactor in accordance with the invention. A high packing density of the substrate chips or discs may be achieved because of the vertical arrangement of the elements 13 to be coated.

It should also be mentioned that the inner walls of the double-walled container 1 may be covered by a heat reflecting layer 17, for example gold, in order to dissipate the heat more successfully.

It will be understood that the above description of the present invention is susceptible to various modifications, changes and adaptations.

I claim:

1. In an epitaxial reactor with a modified heat pipe system for the epitaxial deposition of semiconductor layers on semiconductor substrate discs, comprising an enclosed and evacuable container, a heating tube disposed in the container and enclosing a reaction chamber, a seal covering one end of the heating tube to enclose the reaction chamber, a transport line passing into the container and the reaction chamber and having an outlet end in the vicinity of the seal for introducing reaction gas into the reaction chamber, means defining an outlet extending from the reaction chamber and through the container for the exhaust of reaction gas from the reaction chamber, with the surface of the heating tube which faces the reaction chamber being provided for accommodating the discs, the improvement wherein said heating tube comprises two concentric walls spaced apart to delimit a sealed inner chamber, and said reactor further comprises a heat source and a temperature control system located in said inner chamber and operative for automatically providing a selected, uniform temperature in said reaction chamber based on the saturation temperature of the vapor pressure existing in said inner chamber.

2. An epitaxial reactor as defined in claim 1 wherein sodium is used to produce the vapour pressure in said inner chamber of said heating tube.

3. An epitaxial reactor as defined in claim 1, wherein the heating tube is a double-walled metal tube covered with silicon carbide on its surface facing said reaction chamber.

4. An epitaxial reactor as defined in claim 1, wherein the heat source is a heating coil in said inner chamber of said heating tube and a sensor is arranged additionally in said inner chamber to measure the vapour pressure and is connected for temperature control.

5. An epitaxial reactor as defined in claim 1, wherein the heated tube has a polygonal cross-section.

6. An epitaxial reactor as defined in claim 5 wherein the cross-section of the heated tube is hexagonal.

7. An epitaxial reactor as defined in claim 5 wherein the cross-section of the heated tube is octagonal.

8. An epitaxial reactor as defined in claim 1, wherein the seal comprises a removable dome.

9. An epitaxial reactor as defined in claim 1, wherein the surface of said heated tube which faces said reaction chamber has pockets which accommodate the elements which are to be coated.

10. An epitaxial reactor as defined in claim 9, and comprising frame-like members arranged on said surface of said heated tube which faces said reaction chamber and defining depressions there between for insertion of the elements which are to be coated.

* * * * *